US012559841B2

(12) United States Patent　　　(10) Patent No.: US 12,559,841 B2
Olsen et al.　　　　　　　　　　　　(45) Date of Patent: Feb. 24, 2026

(54) PLENUM DRIVEN HYDROXYL COMBUSTION OXIDATION

(71) Applicant: Applied Materials, Inc., Santa Clara, CA (US)

(72) Inventors: Christopher S. Olsen, Fremont, CA (US); Sameh Helmy, Santa Clara, CA (US); Hansel Lo, San Jose, CA (US); Eric Kihara Shono, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 90 days.

(21) Appl. No.: 18/139,103

(22) Filed: Apr. 25, 2023

(65) Prior Publication Data

US 2024/0360559 A1　　　Oct. 31, 2024

(51) Int. Cl.
*C23C 16/455*　　　(2006.01)
*C23C 16/458*　　　(2006.01)

(52) U.S. Cl.
CPC .. *C23C 16/45559* (2013.01); *C23C 16/45517* (2013.01); *C23C 16/45574* (2013.01); *C23C 16/458* (2013.01)

(58) Field of Classification Search
CPC ................................................... C23C 16/458
See application file for complete search history.

(56) References Cited

U.S. PATENT DOCUMENTS

| | | | |
|---|---|---|---|
| 5,169,453 | A | 12/1992 | Takagi |
| 5,169,684 | A | 12/1992 | Takagi |
| 5,474,612 | A | 12/1995 | Sato et al. |
| 5,779,797 | A | 7/1998 | Kitano |
| 5,848,889 | A | 12/1998 | Tietz et al. |
| 5,879,128 | A | 3/1999 | Tietz et al. |
| 5,960,555 | A | 10/1999 | Deaton et al. |
| 6,133,152 | A | 10/2000 | Bierman et al. |
| 6,200,388 | B1 | 3/2001 | Jennings |
| 6,264,467 | B1 | 7/2001 | Lue et al. |
| 6,280,183 | B1 | 8/2001 | Mayur et al. |
| 6,395,363 | B1 | 5/2002 | Ballance et al. |
| 6,454,865 | B1 | 9/2002 | Goodman et al. |

(Continued)

FOREIGN PATENT DOCUMENTS

| | | |
|---|---|---|
| JP | 05-238882 A | 9/1993 |
| JP | 09-202969 | 8/1997 |

(Continued)

OTHER PUBLICATIONS

International Search Report and Written Opinion dated Jul. 17, 2024 for Application No. PCT/US2024/022941.

(Continued)

*Primary Examiner* — Austin Murata
(74) *Attorney, Agent, or Firm* — Patterson + Sheridan, LLP

(57)　　　　　ABSTRACT

A method and processing chamber for plenum driven hydroxyl combustion oxidation. A mixture is produced in a plenum. The mixture includes a first reactive gas injected from a first inlet and a second reactive gas injected from a second inlet. The mixture is injected towards a substrate of a processing chamber at a jet gas velocity greater than a flame gas velocity. A radical is produced as a function of the first gas and the second gas while heating the chamber.

12 Claims, 9 Drawing Sheets

(56)                References Cited

U.S. PATENT DOCUMENTS

| | | | |
|---|---|---|---|
| 6,494,955 B1 | 12/2002 | Lei et al. | |
| 6,888,104 B1 | 5/2005 | Ranish et al. | |
| 7,127,367 B2 | 10/2006 | Ramachandran et al. | |
| 7,256,375 B2 | 8/2007 | Oosterlaken | |
| 7,414,224 B2 | 8/2008 | Aderhold et al. | |
| 7,648,579 B2 | 1/2010 | Goodman et al. | |
| 7,704,327 B2 | 4/2010 | Waldhauer et al. | |
| 8,287,650 B2 | 10/2012 | Lee et al. | |
| 2003/0138562 A1* | 7/2003 | Subramony | C23C 16/308 |
| | | | 427/255.394 |
| 2003/0186563 A1 | 10/2003 | Kobayashi et al. | |
| 2004/0052512 A1 | 3/2004 | Aderhold et al. | |
| 2005/0191044 A1 | 9/2005 | Aderhold et al. | |
| 2007/0104470 A1 | 5/2007 | Aderhold et al. | |
| 2008/0064184 A1 | 3/2008 | Lackner et al. | |
| 2008/0085591 A1 | 4/2008 | Gomez et al. | |
| 2008/0141942 A1 | 6/2008 | Brown et al. | |
| 2008/0169282 A1 | 7/2008 | Sorabji et al. | |
| 2009/0103905 A1 | 4/2009 | Tanino et al. | |
| 2009/0255921 A1 | 10/2009 | Ranish et al. | |
| 2009/0274454 A1 | 11/2009 | Aderhold et al. | |
| 2010/0044974 A1 | 2/2010 | Kenworthy et al. | |
| 2011/0150764 A1 | 6/2011 | Lee et al. | |
| 2011/0159211 A1 | 6/2011 | Du Bois et al. | |
| 2011/0250764 A1 | 10/2011 | Yokota et al. | |
| 2012/0213500 A1 | 8/2012 | Koelmel et al. | |
| 2014/0057456 A1 | 2/2014 | Tsubota | |
| 2014/0216585 A1* | 8/2014 | Tjandra | H01L 21/67017 |
| | | | 137/896 |
| 2017/0314126 A1* | 11/2017 | Tjandra | C23C 16/4584 |

FOREIGN PATENT DOCUMENTS

| | | |
|---|---|---|
| JP | 2003-059852 | 2/2003 |
| JP | 2006-093283 A | 4/2006 |
| JP | 2009-016567 A | 1/2009 |
| KR | 10-2009-0033791 A | 4/2009 |
| KR | 20110137775 A | 12/2011 |
| KR | 10-2022-0101830 A | 7/2022 |
| KR | 10-2023-0041613 A | 3/2023 |
| WO | 2020-223317 A1 | 11/2020 |

OTHER PUBLICATIONS

International Search Report dated Jan. 16, 2014 for PCT/US2013/060002. (APPM/16922PC02).

International Search Report dated Dec. 12, 2013 for PCT/US13/055167. (APPM/17484PC).

* cited by examiner

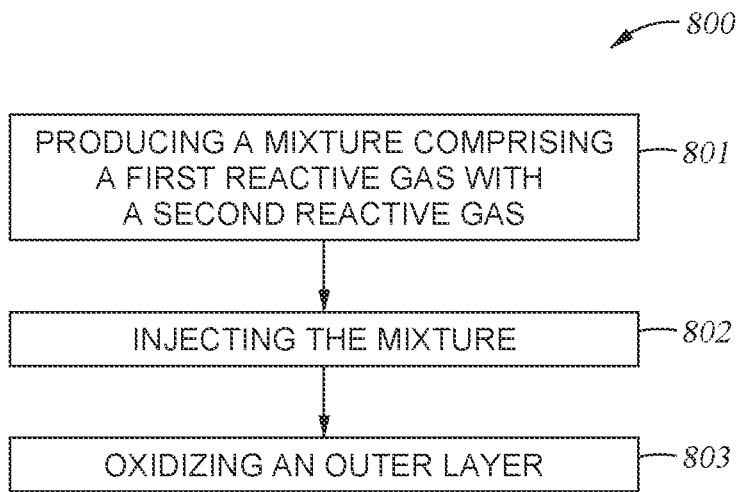
_800_
PRODUCING A MIXTURE COMPRISING
A FIRST REACTIVE GAS WITH
A SECOND REACTIVE GAS    _801_
INJECTING THE MIXTURE    _802_
OXIDIZING AN OUTER LAYER    _803_
_Fig. 8_

PLENUM DRIVEN HYDROXYL COMBUSTION OXIDATION

BACKGROUND

Field

Embodiments of the present disclosure generally relate to a process chamber for processing a substrate.

Description of the Related Art

In the processing of substrates, such as semiconducting substrates, the substrate is placed on a support in a process chamber and suitable processing conditions are maintained in the process chamber. For example, the substrate can be oxidized in a controlled oxidation process to chemically process the substrate. The substrate can be oxidized, for example, by an array of chemicals disposed above and/or below the substrate in the chamber. Oxidation processing can be used, for example, to oxidize silicon nitride to a silicon oxide or oxynitride.

It has been observed that variations in oxidation processes across the substrate can result in non-uniform processing of the substrate. Currently, many non-uniform oxidations occur at different substrate regions, e.g., proximal portions of a memory hole or distal portions of a memory hole, because of low pressure radical oxidation requirements, e.g., less than 10 Torr. Unfortunately, high pressure oxidation processes have been largely unsuccessful due to oxidation radicals being quenched or decaying rapidly. The radicals from high pressure oxidation processes are formed and fail to adequately penetrate the memory holes of the substrate to ensure a uniform oxidation reaction. This is further complicated when using memory holes having high aspect ratios, in which the surface area continues to increase 10-20% for every node of the memory hole.

Accordingly, improved methods of and apparatuses for oxidation processes are needed.

SUMMARY

In an aspect, the disclosure provides a processing chamber. The processing chamber includes a substrate support. The processing chamber includes a controller. The controller is configured to receive a first reactive gas in a plenum via first plurality of inlets, receive a second reactive gas in the plenum via a second plurality of inlets, produce a mixture of the first reactive gas and the second reactive gas, heat the process chamber, inject the mixture from the plenum to the substrate support at a jet gas velocity greater than a flame gas velocity, and produce a radical as a function of the heat and the mixture.

In another aspect, the disclosure provides a method of plenum reactant mixing driven hydroxyl combustion oxidation. The method includes producing a mixture in a plenum, via a controller. The mixture includes a first reactive gas injected from a first inlet and a second reactive gas injected from a second inlet. The mixture is injected towards a first location of the chamber, via the controller, at a jet gas velocity greater than a flame gas velocity. A radical is produced as a function of the first gas and the second gas while heating the chamber.

In another aspect, the disclosure provides a computer readable medium. The computer readable medium is configured to produce a mixture in a plenum, via a controller, wherein the mixture comprises a first reactive gas injected from a first inlet and a second reactive gas injected from a second inlet. The mixture is injected, via the controller, using a plurality of orifices positioned along a first side of the chamber and towards a first location of the chamber, in which the mixture is injected at a jet gas velocity greater than a flame gas velocity. A radical is produced as a function of the mixture while heating the chamber.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 3A depicts a plenum configured to inject a gas to partially cover a processing chamber. FIG. 3A depicts a plenum configured to inject a gas to cover a substrate of a processing chamber.

FIG. 7A depicts a memory hole before oxidation. FIG. 7B depicts a memory hole during hydroxyl radical flow. FIG. 7C depicts a memory hole after hydroxyl radical combustion oxidation.

FIG. 8 is a diagrammatic representation of a method of producing a radical in a processing chamber, according to embodiments of the disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure provides a system for providing a high pressure radical oxidation process while maintaining conformality, throughput, and oxide quality. In certain aspects, the system may allow for increased oxygen radicals or increased hydroxide radicals to be formed for an oxidation process.

In certain aspects, the system is capable of performing high pressure oxidation reactions because of the plurality of orifices or nozzles that promote fuel oxidation combustion reactions. The orifices or nozzles may emit one or more reactive gases, such as hydrogen gas, oxygen gas, or an inert gas. The orifices or nozzles may provide a better spread of gas over the wafer, such that more control over a shape and location of the oxidation process is achievable. The orifices may inject the one or more reactive gases with a velocity greater than 3 m/s at high pressure, e.g., 50-200 Torr, to prevent flame running back upstream. For example, the orifices may inject the one or more reactive gases with a velocity greater than 10 m/s at high pressure, e.g., 50-200 Torr, to prevent flame running back upstream. A velocity of greater than about 3 m/s to about 10 m/s may be faster than a flame velocity, promoting oxidation reactions while maintaining efficient and robust oxidation of the substrate.

Processing Chamber

Figure 1:
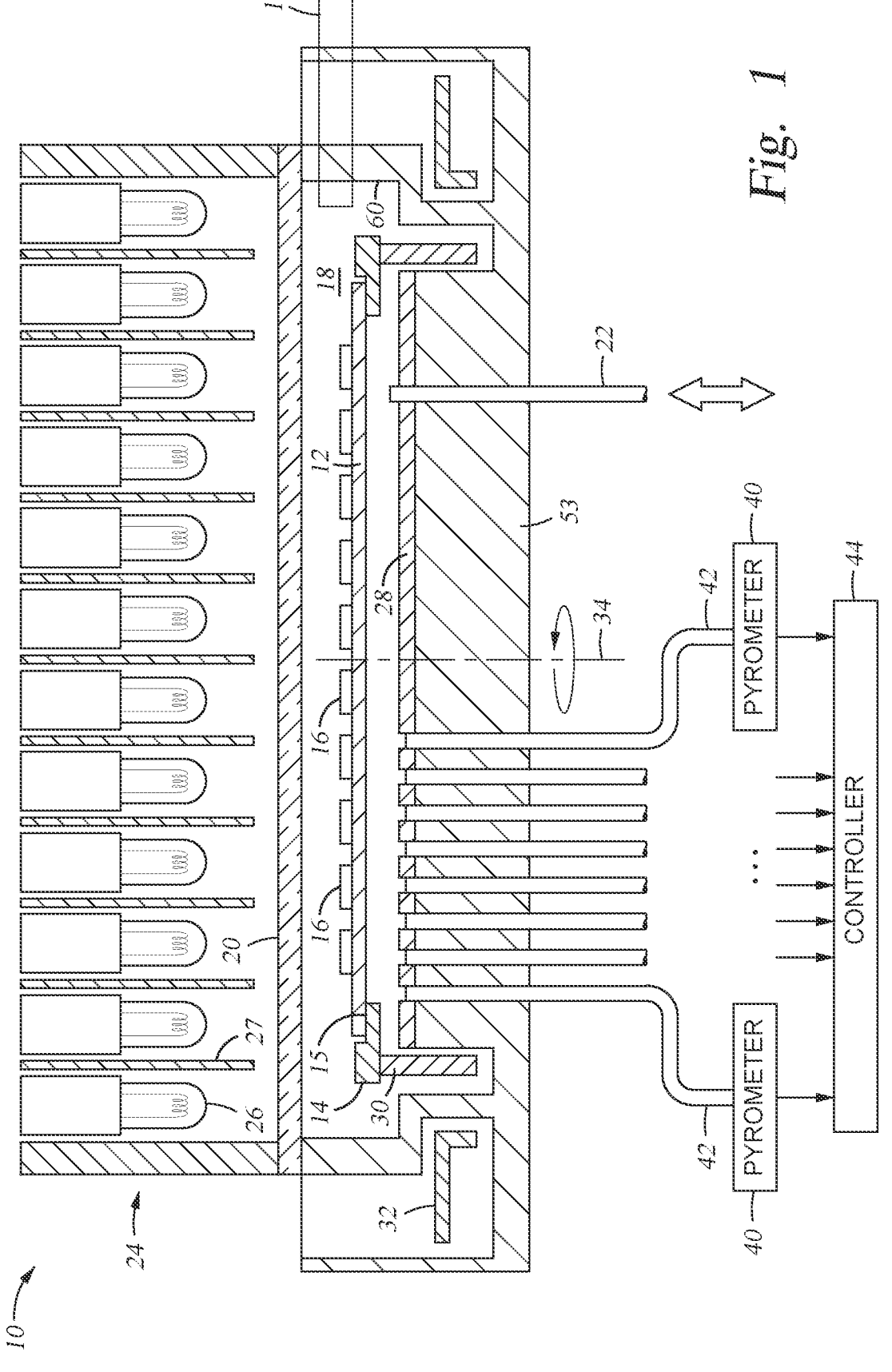
FIG. 1 schematically illustrates an exemplary rapid thermal processing chamber having a substrate support, according to embodiments of the disclosure.

FIG. 1 schematically represents a rapid thermal processing chamber 10. A substrate 12, for example, a semiconductor substrate such as a silicon substrate to be thermally processed is passed through the valve or access port 13 into the process area 18 of the processing chamber 10. The substrate 12 is supported on its periphery by an annular support ring 14. An edge lip 15 extends inward of the annular support ring 14 and contacts the peripheral edge of the substrate 12. The substrate may be oriented such that processed features 16 already formed in a front surface of the substrate 12 face upwardly toward a process area 18 defined on its upper side by a transparent quartz window 20. That is, the front surface of the substrate 12 is facing toward the array of lamps 26. The front surface of the substrate 12 with the processed featured formed thereon may face away from the array of lamps 26, i.e., facing towards the pyrometers 40. Contrary to the schematic illustration, the features 16 for the most part do not project substantial distances beyond the front surface of the substrate 12 but constitute patterning within and near the plane of the front surface.

A plurality of lift pins 22, such as three lift pins, may be raised and lowered to support the back side of the substrate 12 when the substrate is handed between a paddle or robot blade (not shown) bringing the substrate into the processing chamber and onto the support ring 14. A radiant heating apparatus 24 is positioned above the window 20 and configured to direct radiant energy toward the substrate 12 through the window 20. In the processing chamber 10, the radiant heating apparatus may include a large number, 409 being an exemplary number, of high-intensity tungsten-halogen lamps 26 positioned in respective reflective tubes 27 arranged in a hexagonal close-packed array above the window 20. The array of lamps 26 is sometimes referred to as the lamphead. However, it is contemplated that other radiant heating apparatus may be substituted. Generally, these involve resistive heating to quickly ramp up the temperature of the radiant source. Examples of suitable lamps include mercury vapor lamps having an envelope of glass or silica surrounding a filament and flash lamps which comprise an envelope of glass or silica surrounding a gas such as xenon, which provides a heat source when the gas is energized. As used herein, the term lamp is intended to cover lamps including an envelope that surrounds a heat source. The "heat source" of a lamp refers to a material or element that can increase the temperature of the substrate, for example, a filament or gas that can be energized, or a solid region of a material that injects radiation such as a LED or solid state lasers and laser diodes.

As used herein, rapid thermal processing or RTP refers to an apparatus or a process capable of uniformly heating a substrate at rates of about 50° C./second and higher, for example, at rates of about 100° C./second to 150° C./second, and about 200° C./second to 400° C./second. The temperature may be uniformly heated to a temperature range of about 700° C. to about 1,000° C., e.g., about 700° C., about 800° C., about 900° C., about 1,000° C., or the like. The temperature may be uniformly heated to about 800° C. Typical ramp-down (cooling) rates in RTP chambers are in the range of about 80° C./second to 150° C./second. Some processes performed in RTP chambers utilize variations in temperature across the substrate of less than a few degrees Celsius. An RTP chamber with such a heating control system may anneal a sample in less than 5 seconds, for example, less than 1 second, and in some embodiments, milliseconds.

Controlling the temperature across the substrate 12 to a closely defined temperature across the substrate 12 improves process uniformity. One passive means of improving the uniformity may include a reflector 28 disposed beneath the substrate 12. The reflector 28 extends parallel to and over an area greater than the substrate 12. The reflector 28 efficiently reflects heat radiation emitted from the substrate 12 back toward the substrate 12 to enhance the apparent emissivity of the substrate 12. The spacing between the substrate 12 and the reflector 28 may be between about 3 mm to 9 mm, and the aspect ratio of the width to the thickness of the cavity is advantageously greater than 20. The top of reflector 28, which may be made of aluminum and has a highly reflective surface coating or multi-layer dielectric interference mirror, and the back side of the substrate 12 form a reflecting cavity for enhancing the effective emissivity of the substrate, thereby improving the accuracy of temperature measurement. The reflector 28 may have a more irregular surface or have a black or other colored surface to more closely resemble a black-body wall. The reflector 28 may be deposited on a second wall 53, which is a water-cooled base 53 made of metal to heat sink excess radiation from the substrate, especially during cool down. Accordingly, the process area of the processing chamber 10 has at least two substantially parallel walls, of which a first is a window 20, made of a material being transparent to radiation such as quartz, and the second wall 53 which is substantially parallel to the first wall and made of metal significantly not transparent.

One way of improving the uniformity includes supporting the support ring 14 on a rotatable cylinder 30 that is magnetically coupled to a rotatable flange 32 positioned outside the processing chamber 10. A motor (not shown) rotates the flange 32 and hence rotates the substrate about its center 34, which is also the centerline of the generally symmetric chamber. Alternatively, the bottom of the rotatable cylinder 30 may be magnetically levitated cylinder held in place by magnets disposed in the rotatable flange 32 and rotated by rotating magnetic field in the rotatable flange 32 from coils in the rotatable flange 32.

Another way of improving the uniformity divides the lamps 26 into zones arranged generally ring-like about the central axis 34. Control circuitry varies the voltage delivered to the lamps 26 in the different zones to thereby tailor the radial distribution of radiant energy. Dynamic control of the zoned heating is affected by, one or a plurality of pyrometers 40 coupled through one or more optical light pipes 42 positioned to face the back side of the substrate 12 through apertures in the reflector 28 to measure the temperature across a radius of the rotating substrate 12. The light pipes 42 may be formed of various structures including sapphire, metal, and silica fiber. A computerized controller 44 receives the outputs of the pyrometers 40 and accordingly controls the voltages supplied to the different rings of lamps 26 to thereby dynamically control the radiant heating intensity and pattern during the processing. Pyrometers generally measure light intensity in a narrow wavelength bandwidth of, for example, 40 nm in a range between about 700 nm to 1000 nm. The controller 44 or other instrumentation converts the light intensity to a temperature through the well-known Planck distribution of the spectral distribution of light intensity radiating from a black-body held at that temperature. Pyrometry, however, is affected by the emissivity of the portion of the substrate 12 being scanned. Emissivity e can vary between 1 for a black body to 0 for a perfect reflector and thus is an inverse measure of the reflectivity $R=1-\epsilon$ of the substrate back side. While the back surface of a substrate is typically uniform so that uniform emissivity is expected, the backside composition may vary depending upon prior processing. The pyrometry can be improved by further including a emissometer to optically probe the substrate to measure the emissivity or reflectance of the portion of the substrate it is facing in the relevant wavelength range and the control algorithm within the controller 44 to include the measured emissivity.

Substrate Support

Figure 2:
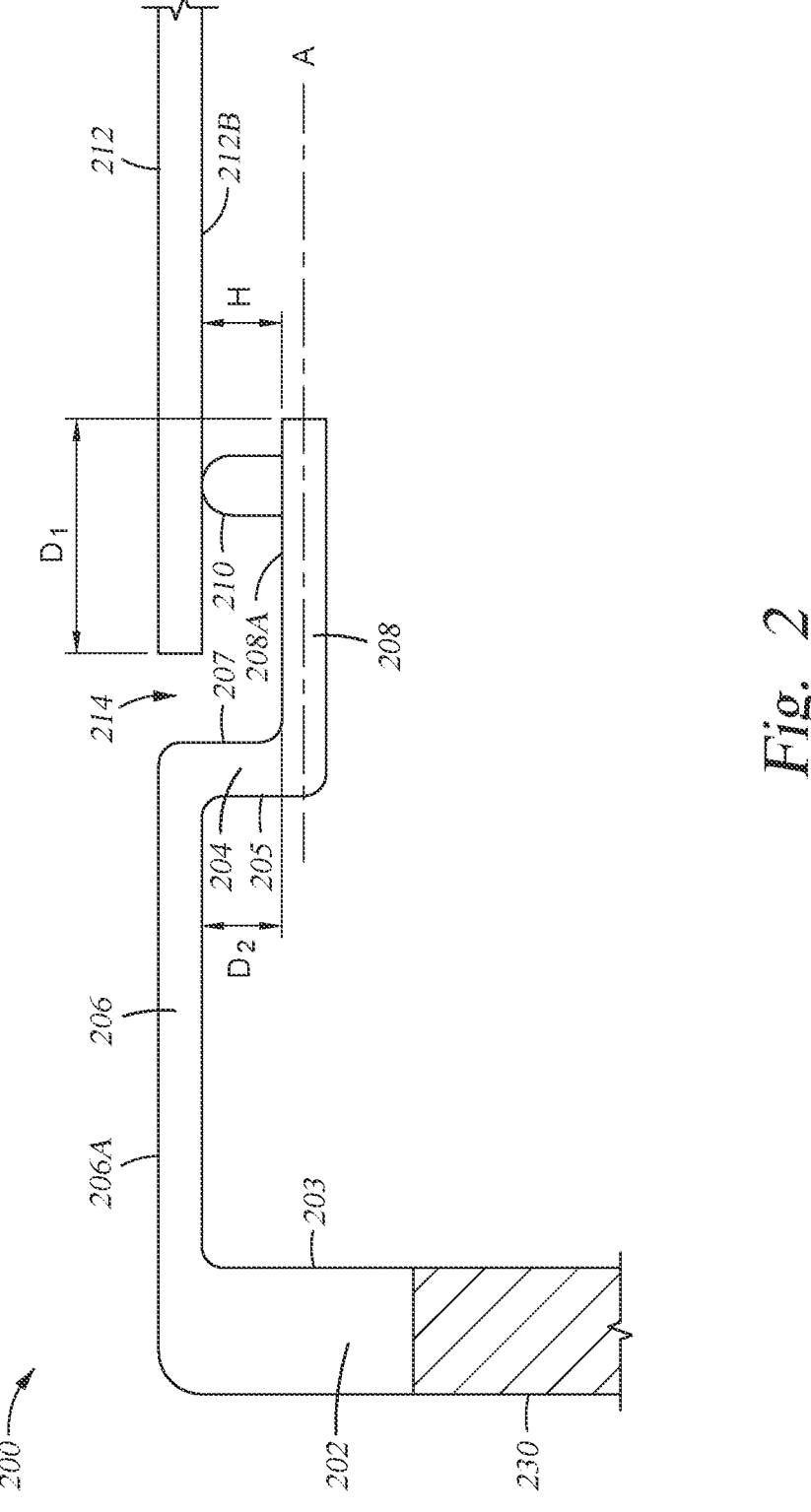
FIG. 2 is a schematic illustrations of cross-sectional views of a support ring, according to embodiments of the disclosure.

FIG. 2 is a schematic cross-sectional side view of a support ring 200 that may be used in place of the support ring 14 of FIG. 1 according to one embodiment. The support ring 200 illustrated in FIG. 2 may be disposed within a processing chamber, for example a rapid thermal processing chamber 10 shown in FIG. 1, and extend radially inwardly along the inner circumferential surfaces 60 of the processing chamber 10. The support ring may be a continuous ring body (or may be discrete ring-like bodies in some embodiments) which substantially surrounds a periphery of the substrate.

The support ring 200 includes an annular body having a central opening, as shown in FIG. 2. The support ring 200 has an outer ring 202 and an inner ring 204. The outer ring 202 connects to the inner ring 204 through a flat portion 206 which extends radially inwardly from an inner perimeter 203 of the outer ring 202 to an outer perimeter 205 of the inner ring 204. The outer ring 202 may be supported by a cylinder 230, such as the rotatable cylinder 30 shown in FIG. 1. For a top-heating type configuration, the rotatable cylinder 230 may contact the support ring 200 just inward from the outer ring 202. That is, the bottom surface of the outer ring 202 is opposite to the top surface 206a of the flat portion 206 to prevent light leakage and provide mechanical stability. The support ring 200 further includes an edge lip 208 which extends radially inwardly from an inner perimeter 207 of the inner ring 204 to form a supporting ledge to support the back surface 212b of the substrate 212 near a peripheral edge of the substrate 212.

The substrate support 210 may be a continuous ring body disposed around the circumference of an edge lip 208. A substrate support 210 with a continuous ring body may be advantageous regardless of the configuration of the heating lamps since the continuous ring body prevents possible light leakage problem by blocking light of source radiation in the process chamber from reaching the pyrometer that is disposed opposing the source radiation. In addition, a continuous ring body is believed to provide a better and stable support for the substrate 212 since the substrate 212 is rotatably supported by the substrate support 210 during the heating process.

The substrate support 210 may be formed on the top surface 208a of the edge lip 208 using a laser machining technique or any suitable technique. The substrate support 210 may be any suitable shape such as rectangular, rhombus, square, hemispherical, hexagonal, triangular protrusions or mixtures of differently shaped protrusions. The substrate support 210 may be any shape having a reduced contact surface with the substrate. For example, the substrate support 210 may have a hemispherical top surface. Hemispherical top surface may be advantageous in terms of effective thermal mass reduction since the hemispherical top surface is able to further reduce the surface contact area between the edge lip and the substrate by turning the surface contact into a continuous line contact or discrete line contacts.

In this disclosure, the "line contact" may refer to a line with a radial width less than about 500 μm, for example, between about 5 μm and about 200 μm, such as 50 μm. The substrate support 210 supports the substrate with minimal contact area and minimal heat transfer between the edge lip 208 and the substrate 212. For a nominal 12 inch (300 mm) substrate, the edge lip 208 to substrate area of contact may be less than about 15 cm² or less, for example about 5 cm² or less, such as about 1 cm² to about 3 cm². It is contemplated that the width of the line that is in physical contact with the back surface of the substrate may vary depending upon the shape of the substrate support 210. It is also contemplated that the shape and/or dimension of the substrate support 210 may vary so long as the substrate 212 is securely supported with minimized contact area between the substrate support 210 and the back surface 212b of the substrate 212. In one example, the dimensions of the substrate support 210 may vary over broad limits between about 0.1 mm and about 10 mm, such as between about 0.2 mm and about 2 mm, for example about 1 mm in width.

Converting surface contact into continuous line contact substantially reduces the contact area available for conductive transfer of heat between the edge lip 208 of the support ring 200 and the substrate 212, thereby eliminating or minimizing excessive temperature gradients in the substrate during thermal processing even at a reduced pressure of about 50 Torr to about 200 Torr, e.g., about 50 Torr, about 60 Torr, about 70 Torr, about 80 Torr, about 90 Torr, about 100 Torr, about 110 Torr, about 120 Torr, about 130 Torr, about 140 Torr, about 150 Torr, about 160 Torr, about 170 Torr, about 180 Torr, about 190 Torr, about 200 Torr, or the like. Reducing the surface contact area between the substrate 212 and the support ring 200 would also allow for better management of the thermal mass discontinuity caused by the overlap of the substrate 212 and the edge lip 208. Therefore, the distortion of the thermal gradient generated by the heat loss around the edge of the substrate is reduced, resulting in an improved temperature profile of across the substrate with a minimum edge temperature gradient. Reduced contact area between the edge lip 208 and the substrate 212 further reduces possible particle contamination in the processing chamber. For top radiant heating arrangement as shown in FIG. 1, the radiation from the radiation heat source can be tailored just to heat up the substrate without worrying too much about the thermal mass discontinuity in the overlap region since the substrate is thermally disconnected from the edge lip 208 through the substrate supports 210. Therefore, the inventive substrate supports may translate to faster attainable heating ramp rates or reduced spike power situation.

The substrate support 210 may be made of a material that is transparent to radiation in the frequency range used for temperature measurements of the substrate. In one example, the substrate support 210 is made of silicon carbide. Other materials, such as silicon carbide alloys, ceramics, or high temperature materials such as amorphous silica, $Al_2O_3$, $ZrO_2$, $Si_3N_4$, or similar material, are also contemplated. The substrate support 210 may be optionally coated with silicon dioxide ($SiO_2$) or any other suitable material to prevent Si—Si bonding with the back surface 212b of the substrate 212 at high temperatures which can lead to potential substrate sticking to the substrate support. The support ring 200 may be made of a material similar to the substrate so as to minimize absorptivity/reflectance mismatch between the substrate and the support ring. In one example, the support ring 200 is made of silicon carbide. The support ring 200 may be optionally coated with a layer of polycrystalline silicon (polysilicon) to render the support ring opaque to radiation in a frequency range used for a temperature measurement of a substrate in a thermal processing chamber. In such a case, the thickness of a polysilicon layer may vary ranging between about 20 μm and about 50 μm, depending upon the thickness of the support ring 200, or depending on opacity of SiC, for example, that is used in the support ring 200.

Processing chamber 10 operates at a pressure of about 50 Torr to about 250 Torr. Processing chamber 10 includes a lamp heating, pyrometer temperature control, or other substrate heating technique to heat a substrate in the chamber, e.g., a resistive heater or an inductive heater that rotates around the substrate to provide uniform heating.

Plenum

The processing chamber includes a plenum 301. The plenum 301 may include a reservoir. The reservoir may have a volume of about 5 cm³ to about 100 cm³. The plenum may have a mixing apparatus. The mixing apparatus may include one or more apparatuses such as a blocker plate.

Figure 3B:
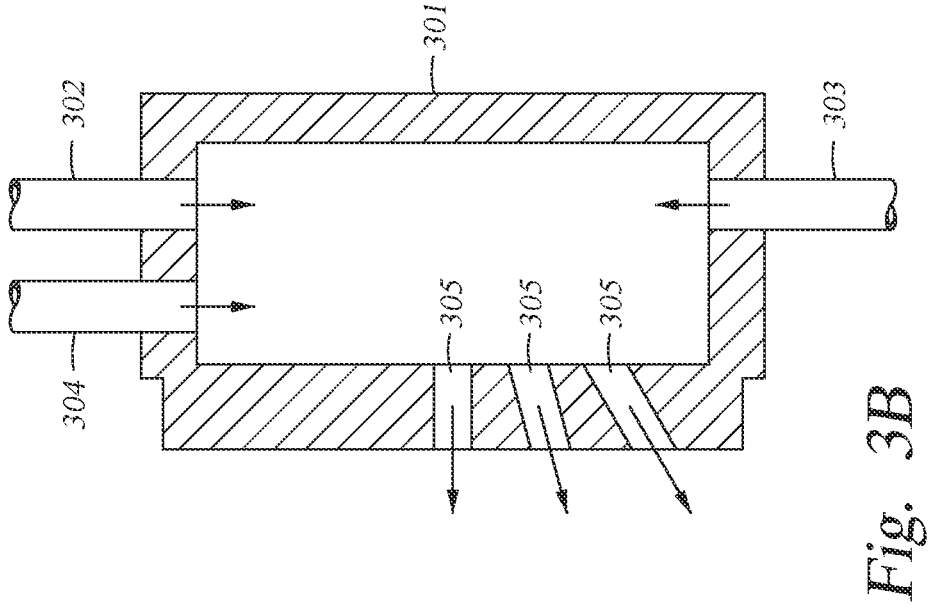
FIGS. 3A and 3B depict an illustration of a plenum having a plurality of orifices, according to embodiments of the disclosure.
Figure 3A:
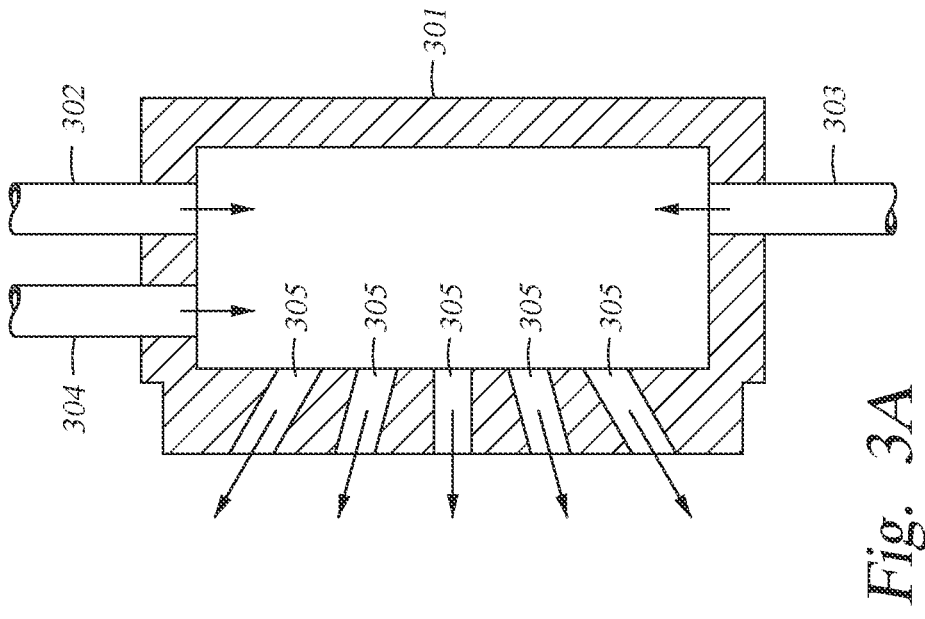

The plenum 301 may have a first inlet 302, as shown in FIGS. 3A and 3B. The first inlet 302 may provide one or more reactive gases to the plenum 301, e.g., $H_2$ or $O_2$. For example, and without limitation, the first inlet 302 may provide a reactive gas of $H_2$ to the plenum 301. The plenum 301 may have a second inlet 303, as shown in FIGS. 3A and 3B. The second inlet 303 may provide one or more reactive gases to the plenum 301, e.g., $H_2$ or $O_2$. The plenum 301 may have a third inlet 304, the third inlet 304 may provide one or more inert gases to the plenum 301, e.g., Ar, He, $N_2$, or the like. For example, and without limitation, the third inlet 304 may provide $N_2$ to the plenum 301.

The plenum 301 is configured to produce a mixture. The mixture includes a mix of two or more reactive gases, e.g., $H_2$ and $O_2$ and a an inert gas, e.g., He, $N_2$, or Ar. For example, the mixture is a mixture such that hydrogen gas is more than 50% of the $H_2:O_2$ mixture. As a further non-limiting example, the plenum 301 produces a mixture such that $H_2$ accounts for between about 50% and about 90%, e.g., about 50%, about 60%, about 70%, or about 80%, of the $H_2$ and $O_2$ mixture. The plenum 301 mixes reactive gases, e.g., $H_2$ or $O_2$, and inert gases, e.g., He, $N_2$, or Ar, such that the reactive gas is more than 50% of the mixture. As a non-limiting example, the plenum mixes $O_2$ and $H_2$ and $N_2$.

The plenum 301 is configured to produce a mixture using a gas from the first inlet 302 and the second inlet 303. The plenum 301 produces a mixture using a reactive gas such as $H_2$ and a reactive gas such as $O_2$. The plenum 301 is configured to produce a mixture using a gas from the first inlet 302 and the third inlet 304. For example, the plenum

301 may produce a mixture using a reactive gas such as $H_2$ and an inert gas such as $N_2$. The plenum 301 is configured to produce a mixture using a gas from the second inlet 303 and the third inlet 304. For example, the plenum 301 may produce a mixture using a reactive gas such as $O_2$ and an inert gas such as $N_2$.

The plenum 301 includes a plurality of orifices 305 to inject the mixture of gases into the processing chamber 10. An orifice 305 has a diameter of about 30 mil to about 100 mil, e.g., about 30 mil, about 40 mil, about 50 mil, about 60 mil, about 70 mil, about 80 mil, about 90 mil, about 100 mil, or the like. The plurality of orifices 305 may range from about 1 to about 15 orifices, e.g., about 3 orifices to about 8 orifices, such as about 1 orifice, about 2 orifices, about 3 orifices, about 4 orifices, about 5 orifices, about 6 orifices, about 7 orifices, about 8 orifices, about 9 orifices, about 10 orifices, about 11 orifices, about 12 orifices, about 13 orifices, about 14 orifices, about 15 orifices, or the like.

The plenum facilitates improved mixing of process gases over the substrate 212, while providing enhanced coverage over the substrate when injecting the mixture of gases. The improved gas introduction of the present disclosure provides for improved radical generation and sustainability, thus improving substrate processing. In particular, oxidation of memory hole sidewalls is improved through increased conformity/uniformity.

The plenum 301 may include a plurality of orifices 35 to inject a gas that partially covers the substrate 212 of the processing chamber 10 when injected or covers the substrate 212 of the processing chamber 10 when injected. For example, the plenum may include about 1 orifice to about 5 orifices, such as about 1 orifice, about 2 orifices, about 3 orifices, about 4 orifices, or about 5 orifices, to inject a gas that partially covers the substrate 212 of the processing chamber, as shown in FIG. 3A. As a further non-limiting example, the plenum may include about 6 orifice to about 15 orifices, such as about 6 orifices, about 7 orifices, about 8 orifices, about 9 orifices, about 10 orifices, about 11 orifices, about 12 orifices, about 13 orifices, about 14 orifices, about 15 orifices, or about 15 orifices, to inject a gas that covers the substrate 212 of the processing chamber, as shown in FIG. 3B. Improved coverage and reaction efficiency between the hydrogen molecular gas and the oxygen molecular gas occurs due to the number of pre-mixing of the hydrogen and oxygen gas in the plenum. The improved reaction efficiency results in uniform oxidation of the substrate memory hole, described below.

Figure 4:
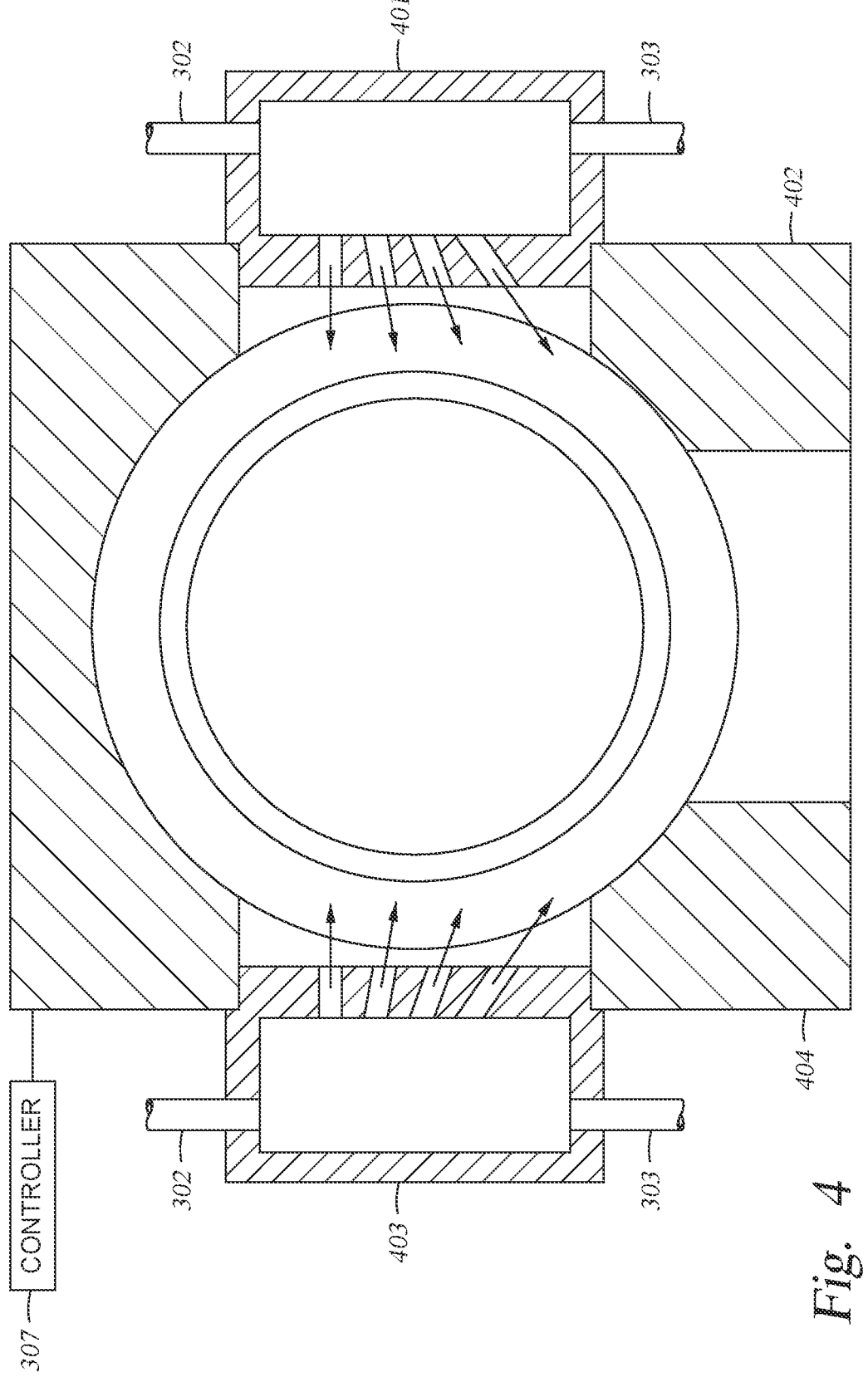
FIG. 4 depicts an illustration of a substrate chamber having a plurality of plenums configured to inject a gas to partially cover a processing chamber, according to embodiments of the invention.
Figure 5:
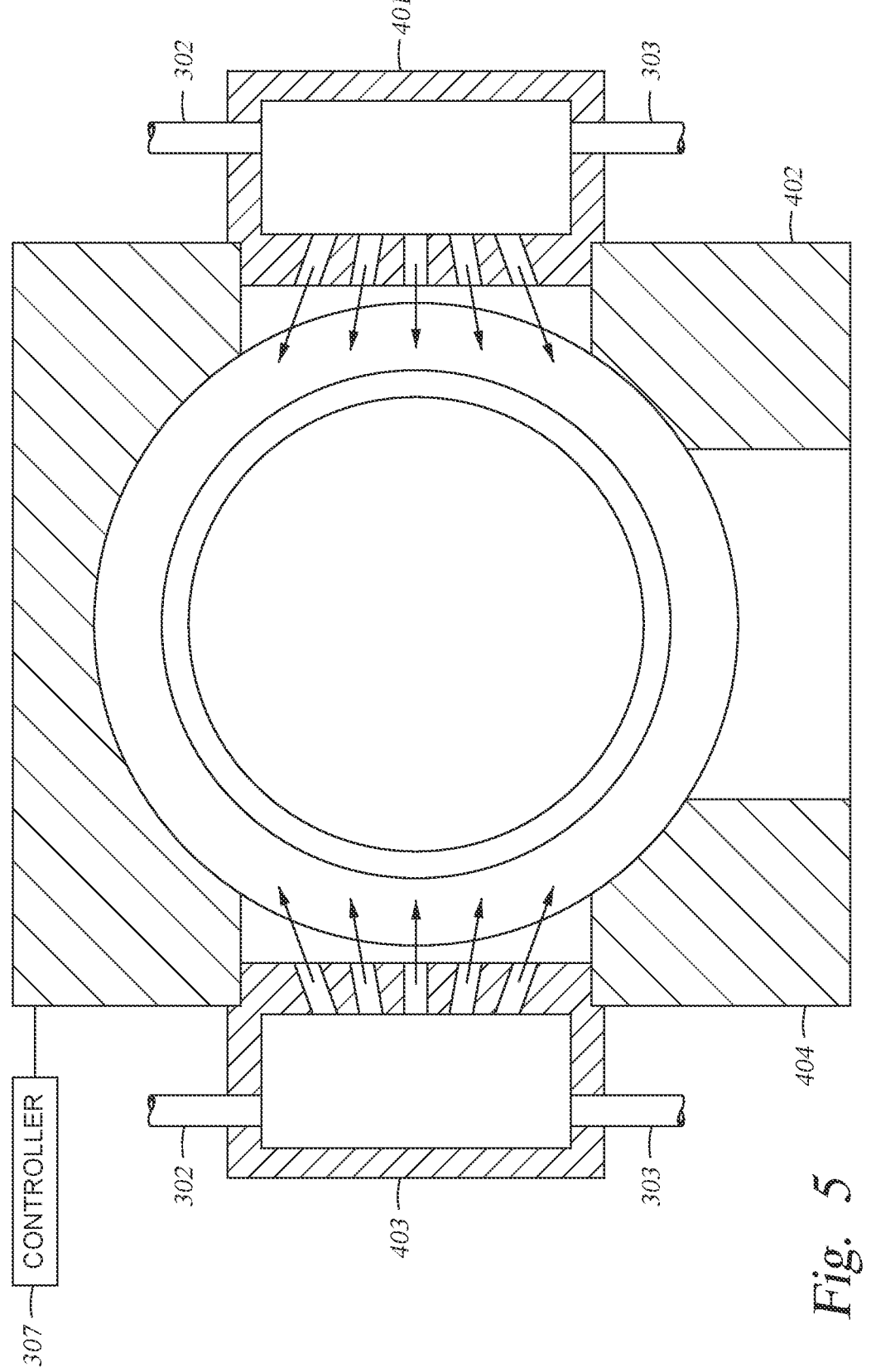
FIG. 5 depicts an illustration of a substrate chamber having a plurality of plenums configured to inject a gas to a processing chamber, according to embodiments of the invention.

The orifice 301 is configured to inject the mixture of gases towards a first location of the chamber. A first plenum 401 may be positioned along a first side 402 of the processing chamber 10 such that the plurality of orifices 305 is oriented the first location of the chamber. The first location includes a central opening of the chamber, an edge of the substrate support, or half a radius of the processing chamber. The plurality of orifices 305 may be positioned to inject the mixture of gases substantially perpendicular from the first side 402 of the processing chamber 10. A second plenum 403 may be positioned along a second side 404 of the processing chamber 10 such that the plurality of orifices 305 are oriented a second location of the chamber. The plurality of orifices 305 may be positioned to inject the mixture of gases substantially perpendicular from the second side 404 of the processing chamber 10. The second location includes a central opening of the chamber, an edge of the substrate support, or half a radius of the processing chamber. For example, and without limitation, the first plenum 401 and the second plenum 403 may include a plurality of orifices to inject a gas that partially covers the substrate 212 of the processing chamber 10 when injected, as shown in FIG. 4. As a further non-limiting example, the first plenum 401 and the second plenum 403 may include a plurality of orifices to inject a gas that covers the substrate 212 of the processing chamber 10 when injected, as shown in FIG. 5.

Figure 6:
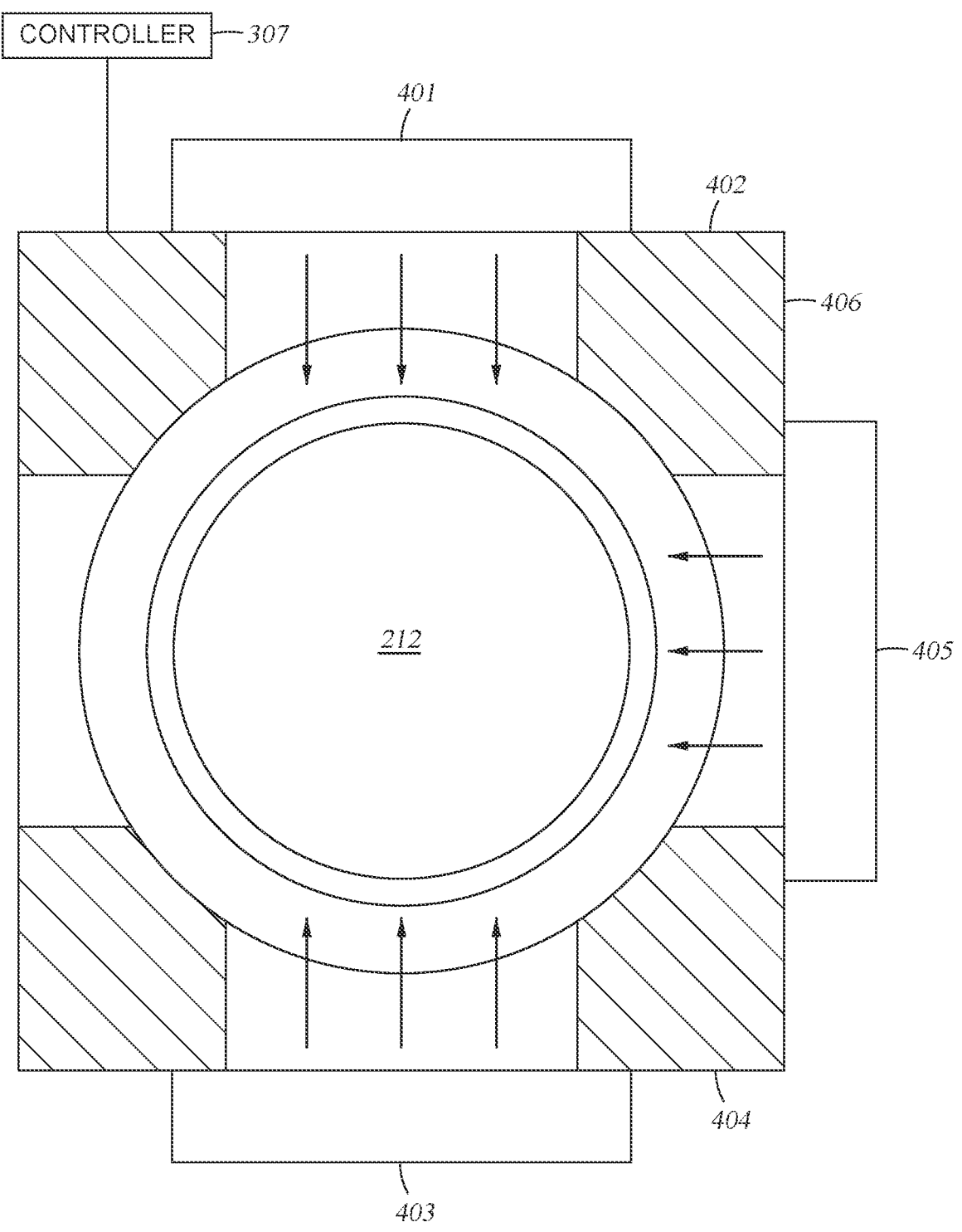
FIG. 6 depicts an illustration of a substrate chamber having a plurality of plenums configured to inject a gas to cover a substrate of a processing chamber, according to embodiments of the invention.

A third plenum 405 may be positioned along a third side 406 of the processing chamber 10 such that the plurality of orifices 305 is oriented towards a third location. The plurality of orifices 305 may be positioned to inject the mixture of gases substantially perpendicular from the third side 406 of the processing chamber 10, as shown in FIG. 6. The third location includes a central opening of the chamber, an edge of the substrate support, or half a radius of the processing chamber. As a non-limiting example, the first plenum 401, the second plenum 403, and the third plenum 405 may include a plurality of orifices to inject a gas that covers the substrate 212 of the processing chamber 10 when injected, as shown in FIG. 6.

Substrate Memory Hole

The substrate 212 may include a memory hole 703. A "memory hole," as used herein, refers to a vertical channel extending two or more physical levels of the substrate 212. The substrate 212 may include a plurality of plurality of memory holes. The memory holes may include a vertical trench that is formed to divide one or more memory hole structures into two or more vertical "NOT AND" (NAND) strings. A memory hole may include a vertical channel extending 32, 48, 64, 96, 112, or more, layers of a substrate 212.

The plurality of memory holes have a substantially vertical and uniform vertical trench. The plurality of memory holes have one or more vertical features, e.g., necking, clogging, bowing, striations, tapered profiles, underlayer recesses, distortions, tiltings, twistings, or the like. The plurality of memory holes has a first vertical trench comprising a tapered profile extending 16 layers, in which a second vertical trench comprising a tapered profile extends beyond the first vertical trench, creating a shelf, as shown in FIG. 7B.

The plurality of memory holes includes an outer layer 701 within the vertical trench. The outer layer 701 may include a layer of one or more silica substrates, e.g., silicon nitride, silicon dioxide, or the like. The outer layer 701 may be a silicon nitride layer. The outer layer 701 is oxidized to a silicon dioxide layer by a hydroxyl radical 702, as described below.

Controller

The processing chamber 10 includes a controller 405. Each controller may be a local controller associated with, and programmed to control, a corresponding single plenum or a corresponding group of plenums. For example, and without limitation, each local controller 405 may control a single plenum. As a further non-limiting example, the controller 405 may be configured to control a plurality of plenums. In an example, the controller 405 includes an application-specific integrated circuit (ASIC). Each controller 405 may be integrated into the processing chamber 10. Each controller 405 may be coupled to a PCB separate from the processing chamber 10. The controller 405 includes an electromagnetic shield. To inhibit corrosion, it is contemplated that surfaces of the controller 405 may be coated with one or more suitable materials. Examples of coating materials include silicon carbide, parylenes, hydrophobic anti-stiction films applied by molecular vapor deposition, ceramics, aluminum oxides (such as $Al_2O_3$), yttrium oxides (such as $Y_2O_3$), silicon oxides (such as $SiO_x$), titanium oxides (such as $TiO_2$), and the like.

The controller 405 receives commands from a master controller via a PCB, or it itself a master controller. It is contemplated that the commands may be in the form of a signal that is addressed to correspond with a specific device or plenum, such as a specific plenum of the processing chamber. Each controller 405 is programmed to recognize command signals addressed to correspond with devices under the purview of controller 405, and controls the plenums according to the commands received. Each controller 405 is programmed to ignore command signals that are not addressed to correspond with any of the orifices under the purview of controller 405.

Each plenum is independently addressable via a corresponding controller 405, such that the operation of each plenum can be controlled without changing the operating status of any other plenums in the processing chamber 10. Each plenum is assigned to one or more groups of plenums, and each group of plenums is independently addressable via one or more corresponding controllers 405. The operation of each plenum within a defined group can be controlled without changing the operating status of any other plenum that is not within the defined group.

Oxidation Process

Now referring to FIG. 8, a method of plenum driven hydroxyl combustion oxidation includes producing a mixture in a plenum, via a controller instruction, having a first gas and a second gas. The processing chamber may have a substrate disposed therein. The mixture includes a first reactive gas, e.g., $H_2$, $O_2$, or the like, a second reactive gas, e.g., $H_2$, $O_2$, and an inert gas, e.g., $N_2$, Ar, He, or the like. For example, and without limitation, the mixture includes a first gas of $H_2$, a second gas of $O_2$, and a third gas of $N_2$.

The plenum 301 may produce a mixture having two or more reactive gases, e.g., $H_2$ and $O_2$, in which the $H_2$ is more than 50% of the $H_2$:$O_2$ mixture. For example, the plenum 301 may produce a mixture such that $H_2$ accounts for between about 50% and about 90%, e.g., about 50%, about 60%, about 70%, about 80%, or about 90% of the mixture. The plenum 301 produces a mixture having two or more reactive gases, e.g., $H_2$ and $O_2$, and one or more inert gases, e.g., $N_2$, He, or Ar, in which the $H_2$ is more than 50% of the mixture. The plenum 301 may produce a mixture having two or more reactive gases, e.g., $H_2$ and $O_2$, and one or more inert gases, e.g., $N_2$, He, or Ar, in which the inert gas is more than 50% of the mixture. For example, the plenum 301 may produce a mixture such that the inert gas accounts for between about 50% and about 90%, e.g., about 50%, about 60%, about 70%, about 80%, or about 90% of the mixture.

The method 800 includes injecting the mixture 212 via the controller. The mixture may be injected from the plenum 301 towards a first location of the chamber. The plenum 301 may inject the mixture towards the first location of the chamber at a volumetric flow rate of about 1 slm to about 40 slm, e.g., about 1 slm, about 2 slm, about 3 slm, about 4 slm, about 5 slm, about 6, slm, about 7 slm, about 8 slm, about 9 sim, about 10 slm, about 11 slm, about 12 slm, about 13 slm, about 14 slm, about 15 slm, about 16 slm, about 17 slm, about 18 slm, about 19 slm, about 20 sim, about 21 sim, about 22 slm, about 23 slm, about 24 slm, about 25 slm, about 26 slm, about 27 slm, about 28 sim, about 29 slm, about 30 slm, about 31 slm, about 32 sim, about 33 slm, about 34 slm, about 35 slm, about 36 slm, about 37 slm, about 38 slm, about 39 slm, about 40 slm or the like. The plenum 301 may inject a mixture having a reactive gas of $O_2$ of about 1 to about 15 slm, e.g., about 9.4 slm, a reactive gas of $H_2$ of about 1 to about 30 slm, e.g., about 22 slm, and an inert gas of $N_2$ of about 1 slm to about 40 slm e.g., about 40 slm.

The mixture is injected from the plenum 301 towards the first location of the chamber at a gas velocity of about 1 m/s to about 20 m/s, e.g., about 1 m/s, about 2 m/s, about 3 m/s, about 4 m/s, about 5 m/s, about 6 m/s, about 7 m/s, about 8 m/s, about 9 m/s, about 10 m/s, about 11 m/s, about 12 m/s, about 13 m/s, about 14 m/s, about 15 m/s, about 16 m/s, about 17 m/s, about 18 m/s, about 19 m/s, about 20 m/s, or the like. The mixture is injected from the plenum 301 towards the first location of the chamber with enough gas velocity to spread the gases over the substrate, promoting enhanced reaction efficiency and uniform oxidation of the outer layer of a memory hole of the substrate. The plenum 301 injects the first gas towards the first location of the chamber such that the jet gas velocity exceeds a flame velocity of about 2 m/s to about 10 m/s.

The plenum 301 has a ratio of conductance relative to the plurality of orifices. The plenum 301 has a ratio of conductance relative to the plurality of orifices 305 of about 10:1 to about 40:1, e.g., about 10:1, about 15:1, about 20:1, about 25:1, about 30:1, about 35:1, about 40:1, or the like. The plenum 301 may have a ratio of conductance relative to the plurality of orifices 305 of about 10:1. The plenum may have a ratio of conductance relative to the plurality of orifices 305 of about 30:1. The ratio of conductance allows for variability of the reaction between $O_2$ and $H_2$ such that a hydroxyl radical may be controlled and modified.

Figure 9:
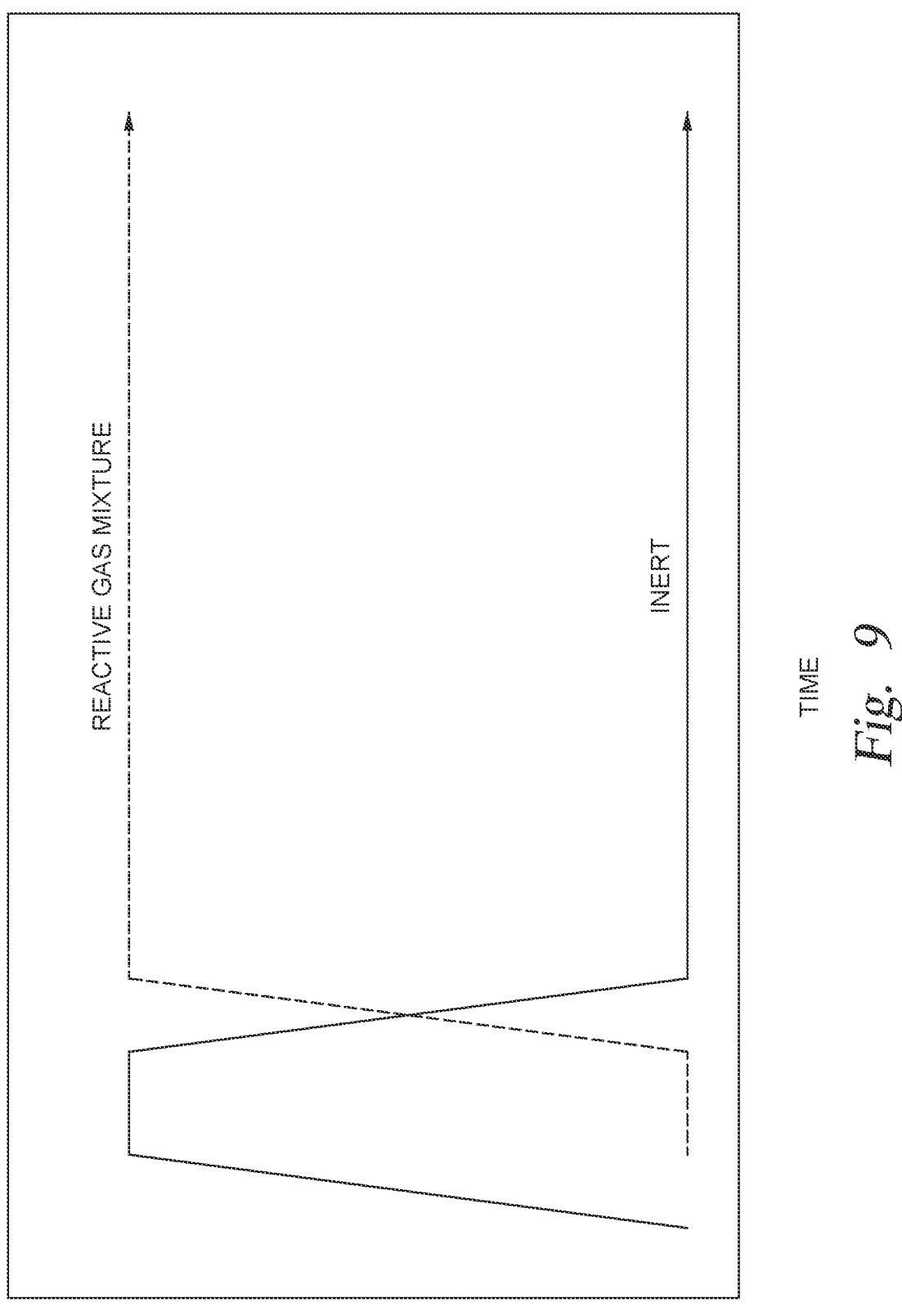
FIG. 9 depicts a diagrammatic representation of injecting varying mixture ratios into the processing chamber, according to embodiments of the disclosure.

The plenum 301 may inject the mixture a first location of the chamber according to a gradient, as shown in FIG. 9. A "gradient," as used herein, refers to a change in jet gas velocity of the mixture over time. A gradient may denote a first jet gas velocity to be injected by the plenum 301. The first jet gas velocity may include an inert gas velocity of between about 60% and about 100% and a reactive gas mixture velocity of between about 0% to about 40% of the mixture, as shown in FIG. 9. The gradient may proceed to a second jet gas velocity over a period of time, e.g., seconds, minutes, hours, days, or the like. The second jet gas velocity may include an inert gas velocity of between about 40% and about 60% and a reactive gas mixture velocity of between about 40% to about 60%, as shown in FIG. 9. The gradient may proceed to a third jet gas velocity over a period of time, e.g., seconds, minutes, hours, days, or the like. The third jet gas velocity may include an inert gas velocity of between about 0% and about 40% of the mixture and the reactive gas mixture is between about 100% to about 40% of the mixture, as shown in FIG. 9. The third jet gas velocity may be held for a period of time, e.g., seconds, minutes, hours, days, or the like to ensure proper oxidation of the substrate 212, as shown in FIG. 9.

The method 700 includes injecting the mixture while rotating the substrate 212 on the rotatable cylinder 30, described above. The method 700 includes injecting the mixture while the pressure of the processing chamber is about 50 Torr to about 200 Torr. For example, injecting the mixture may occur while the pressure of the processing chamber is at a reduced pressure of about 50 Torr to about 200 Torr, e.g., about 50 Torr, about 60 Torr, about 70 Torr, about 80 Torr, about 90 Torr, about 100 Torr, about 110 Torr, about 120 Torr, about 130 Torr, about 140 Torr, about 150 Torr, about 160 Torr, about 170 Torr, about 180 Torr, about 190 Torr, about 200 Torr, or the like.

The method of hydroxyl combustion oxidation 800 includes producing a radical as a function of the mixture.

Producing the radical includes producing a hydroxyl radical as a function of a reaction of the mixture of gases being injected from the plenum 301 towards the substrate 212. For example, the hydroxyl radical may be formed as a function of reacting oxygen and hydrogen in the mixture. The reaction of the oxygen and hydrogen in the mixture may result in about 5% to about 20% of products being hydroxyl radical, e.g., about 5%, about 6%, about 7%, about 8%, about 9%, about 10%, about 11%, about 12%, about 13%, about 14%, about 15%, about 16%, about 17%, about 18%, about 19%, about 20%, or the like. A reaction of the mixture may produce a hydroxide radical in processing chamber 10 when hydrogen gas is more than 50% present in a $H_2:O_2$ mixture. For example, a hydroxide radical may be formed when hydrogen gas of an $H_2:O_2$ mixture is between 50% and 90%.

Figure 7C:
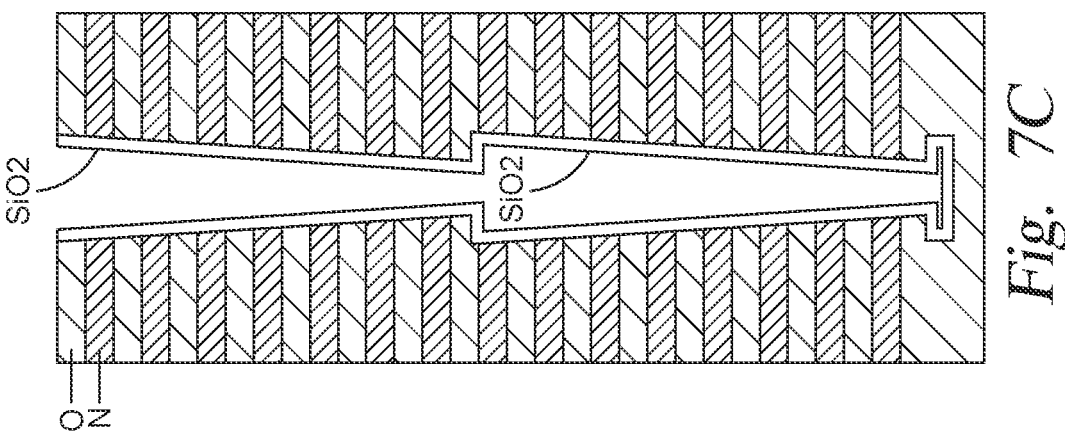
FIGS. 7A-7C depict diagrammatic representations of a memory hole of a substrate, according to embodiments of the disclosure.
Figure 7B:
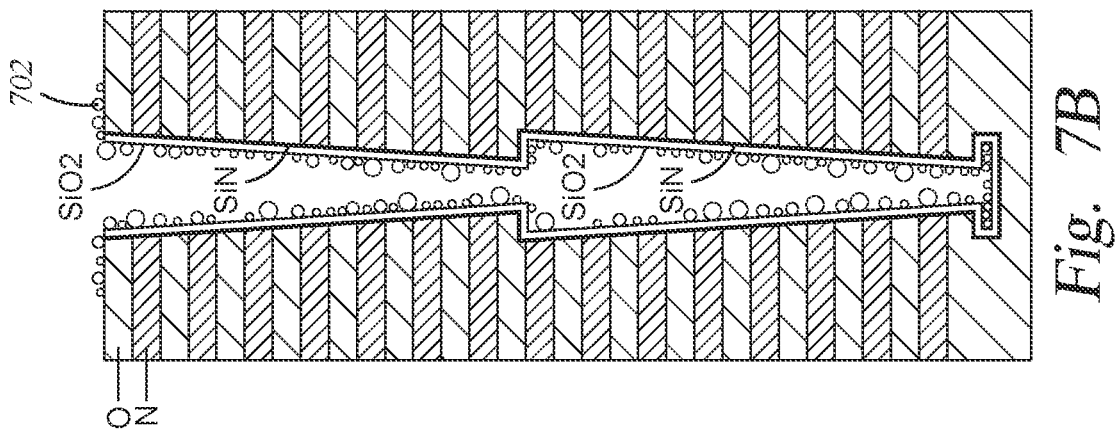
Figure 7A:
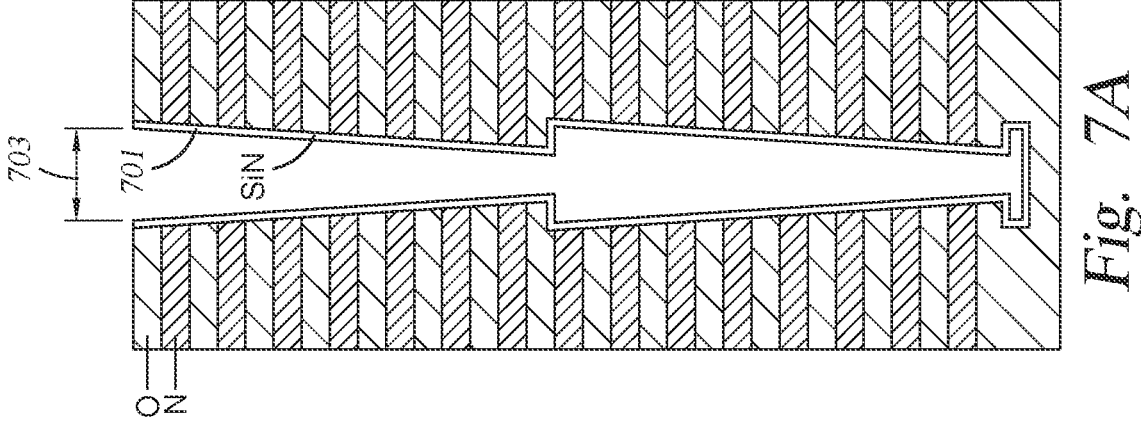

Producing a radical may include oxidizing the outer layer 701 from a silicon nitride layer to a silicon dioxide layer, as shown in FIGS. 7A-7C. A hydroxyl radical 702 is produced via a reaction of the mixture, in which the hydroxyl radical flows into a memory hole 703 of the substrate 212, as shown in FIG. 7A. The hydroxyl radical 702 flows into the memory hole 703 to provide good conformality, as shown in FIG. 7B. For example, the hydroxyl radical flows into the memory hole to provide 99% conformality on 200:1 AR in a high partial pressure oxidant 100 Torr processing chamber. The hydroxyl radical 702 reacts with the silicon nitride outer layer 701, oxidizing the outer layer 701 to silicon dioxide, as shown in FIG. 7C.

The oxidation of the outer layer 701 may have a thickness. The thickness of oxidation of the outer layer 701 may be proportional to the amount of hydroxyl radical produced via the reaction between the first gas and the second gas. The thickness of oxidation of the outer layer 701 may be equal to the amount of hydroxyl radical produced via the reaction between the first gas and the second gas.

While the foregoing is directed to embodiments of the present disclosure, other and further embodiments of the disclosure may be devised without departing from the basic scope thereof, and the scope thereof is determined by the claims that follow.

What is claimed is:

1. A process chamber, comprising:
a first side, a second side, and a third side, wherein the first side, the second side, and the third side are different;
a substrate support disposed within the process chamber;
a first plenum located on the first side, wherein the first plenum is a first enclosed structure, comprising:
a first inlet configured to allow a first gas into the plenum;
a second inlet configured to allow a second gas into the plenum, wherein the first inlet and the second inlet are different, and wherein the first gas and the second gas are different; and
a plurality of outlets facing the substrate support and configured to provide a mixture of the first gas and the second gas toward the substrate support at a jet gas velocity greater than a flame gas velocity;
a second plenum located on the second side, wherein the second plenum is a second enclosed structure having a plurality of gas inlets on one or more first walls of the second enclosed structure, and wherein the second plenum has a plurality of gas outlets on one or more second walls of the second enclosed structure facing the substrate support; and
a third plenum located on the third side.

2. The chamber of claim 1, wherein the first gas is a reactive gas comprising $H_2$ or $O_2$.

3. The chamber of claim 2, wherein the second gas is a reactive gas comprising $H_2$ or $O_2$.

4. The chamber of claim 1, wherein the plurality of outlets comprises about 3 orifices to about 20 orifices.

5. The chamber of claim 1, wherein:

a first inlet of the plurality of gas inlets of the second plenum is configured to allow a third gas into the second plenum;

a second inlet of the plurality of gas inlets of the second plenum is configured to allow a fourth gas into the second plenum; and the plurality of gas outlets of the second plenum are configured to provide a mixture of the third gas and the fourth gas toward the substrate support at a jet gas velocity greater than a flame gas velocity.

6. The chamber of claim 5, wherein the second plenum further comprises a third inlet configured to allow an eighth gas into the second plenum, wherein the third inlet is separate from the first inlet and the second inlet.

7. The chamber of claim 6, wherein the eighth gas is different than the third gas and the fourth gas.

8. The chamber of claim 5, wherein the third plenum is a third enclosed structure and further comprises:

a first inlet configured to allow a fifth gas into the third plenum;

a second inlet configured to allow a sixth gas into the third plenum; and a plurality of outlets facing the substrate support and configured to provide a mixture of the fifth gas and the sixth gas toward the substrate support at a jet gas velocity greater than a flame gas velocity.

9. The chamber of claim 8, wherein the third plenum further comprises a third inlet configured to allow a ninth gas into the third plenum, wherein the third inlet is separate from the first inlet and the second inlet.

10. The chamber of claim 9, wherein the ninth gas is different than the fifth gas and the sixth gas.

11. The chamber of claim 1, wherein the first plenum further comprises a third inlet configured to allow a seventh gas into the first plenum, wherein the third inlet is separate from the first inlet and the second inlet.

12. The chamber of claim 11, wherein the seventh gas is different than the first gas and the second gas.

\* \* \* \* \*